United States Patent [19]

Cowan

[11] Patent Number: 5,672,225

[45] Date of Patent: Sep. 30, 1997

[54] METHOD FOR ENGRAVING THREE DIMENSIONAL IMAGES

[76] Inventor: John R. Cowan, Oakfield House, Campbeltown, Argyll (PA28 6PH), Scotland

[21] Appl. No.: 526,432

[22] Filed: Sep. 11, 1995

[51] Int. Cl.⁶ .................................................. B32B 31/00
[52] U.S. Cl. .................. 156/275.5; 156/154; 156/272.2; 430/5; 430/270.1; 430/396
[58] Field of Search .................. 156/272.2, 275.5, 156/154; 264/401; 425/174.4; 430/5, 269, 270.1, 396

[56] References Cited

U.S. PATENT DOCUMENTS

| | | | |
|---|---|---|---|
| 1,720,568 | 7/1929 | Philip | 451/30 |
| 2,065,406 | 12/1936 | Silverman | 428/13 |
| 2,548,565 | 4/1951 | Staehle | 430/310 |
| 2,555,077 | 5/1951 | Fuller, Jr. | 156/154 |
| 2,666,008 | 1/1954 | Enslein et al. | 216/20 |
| 2,936,209 | 5/1960 | Dombrowski et al. | 8/478 |
| 3,808,751 | 5/1974 | Usui | 451/31 |
| 4,093,754 | 6/1978 | Parsons | 427/259 |
| 4,133,919 | 1/1979 | Parsons | 427/259 |
| 4,193,797 | 3/1980 | Cohen et al. | 430/258 |
| 4,430,416 | 2/1984 | Goto et al. | 430/263 |
| 4,456,680 | 6/1984 | Nakamura et al. | 430/258 |
| 4,587,186 | 5/1986 | Nakamura et al. | 430/14 |
| 4,716,096 | 12/1987 | Cooper et al. | 430/323 |
| 4,858,394 | 8/1989 | Lalumiere et al. | 451/31 |
| 5,326,659 | 7/1994 | Liu et al. | 430/5 |
| 5,370,762 | 12/1994 | Zukowski et al. | 156/154 |
| 5,489,509 | 2/1996 | Kawabata et al. | 430/5 |
| 5,545,367 | 8/1996 | Bae et al. | 264/401 |
| 5,558,884 | 9/1996 | Hug et al. | 425/174.4 |

Primary Examiner—James Sells

[57] ABSTRACT

A simplified method for producing a smoothly graduated, three dimensional engraving in a substrate using a shotblast resist. The method includes preparing a continuous tone transparency having various levels of tone which correspond to the varying levels of depth required in desired image to be engraved into the substrate. A resist film is then contact exposed through its film base and through the continuous tone transparency of the image to an actinic source of electromagnetic radiation for a specific quantity of exposure and the varying levels of radiation transmission through the various tones of the transparency result in a controlled differential exposure of the resist film. This correspondingly results in progressive hardening and toughening through the resist film from its film base according to the various levels of actinic radiation to which it is exposed. The unhardened areas are then washed out and a resist having a smoothly varying thickness is thus produced. The resist is then bonded to the substrate and shotblasted. As the shotblasting process proceeds, the thinner areas of the resist are progressively worn away, exposing more and more of the substrate to the action of the shot and thus automatically producing a controlled and smoothly graduated three dimensional cut into the substrate.

11 Claims, 3 Drawing Sheets

METHOD FOR ENGRAVING THREE DIMENSIONAL IMAGES

This application is a Nonprovisional Application based on Provisional application Ser. No. 60/001,564 which was filed on Jul. 27, 1995, the entirety of which is incorporated herein by reference.

BACKGROUND OF THE INVENTION

This invention relates to a method for producing a smoothly graduated, three dimensional engraving in a substrate utilizing a shotblast resist.

Resists are widely used in shotblast engraving. When closely bonded to a suitable substrate, the resist allows a chosen image to be engraved by protecting certain areas of the substrate and leaving others exposed. The longer the substrate is exposed to the shotblasting process, the deeper the engraving will tend to be.

One of the most widely used types of engraving resists is the screen printed paper resist. This type of resist is produced by a multiple stage process which first involves making a printing screen of the desired image. Using this prepared screen, plastisol ink is printed onto paper and then the printed image is heat cured to produce the finished resist. In use, the resist is bonded onto the substrate and, while the cured ink protects any areas that it covers, the shotblasting process soon disposes of any exposed areas of paper and thus exposes those areas of the substrate to its action.

A second method of producing engraving resists is to cut them out from self-adhesive vinyl or rubber sheet. This may be done by hand or, more usually, by means of a computer controlled cutter and may be done while the resist material is still in sheet form or it may be done after it has been adhered to the substrate. In either case, the resist having been adhered to the substrate and any desired areas picked out, any substrate that remains thus exposed may then be engraved.

A third category of resist may be made by exposing a photopolymer film to actinic light through a transparency of the desired image. This results in hardening of the exposed areas, while the unexposed areas, shaded by the designed image on the transparency, remain soluble. The soluble areas are washed away and the resultant resist is then adhered to the substrate by one of a number of (mostly proprietary) methods and shotblast engraved as above.

A primitive three dimensional effect may be produced from any of these types of resist by shotblasting the unprotected areas and then removing selected areas of the remaining protecting resist and shotblasting the whole area again. If removal is done once, the substrate parts that are freshly exposed are shotblasted once and the parts that were originally exposed are shotblasted twice, resulting in two different depths of engraving according to the two different amounts of time for which the substrate is exposed to the shotblasting. Removal of selected areas of the resist may be undertaken a number of times to produce a variety of different engraving depths.

This method of producing three dimensional engraving has two substantial disadvantages. First, it can be extremely time consuming for workers to pick out the various next areas of the design to produce the required varying depths- each piece having to be shotblasted, then the resist picked out, then shotblasted and then picked out as many times as the design requires depths. Second, it is virtually impossible to avoid noticeable steps being produced between the various depths and a smoothly graduated image cannot be produced.

Alternative methods of producing three dimensional images are by means of using a relatively small shotblasting nozzle compared to the scale of the workpiece and using it to selectively carve away areas of the substrate, or by using the traditional methods of copper wheel engraving or the similar and more recently developed diamond wheel engraving.

Any of these processes require considerable skill and time in their operation. It takes a number of years for a copper wheel engraver to serve an apprenticeship. It would then take this highly skilled craftsperson a substantial mount of time to engrave a design.

An effective engraving resist for producing three dimensional images has now been developed which utilizes a simple process and which substantially mitigates the disadvantages of prior art shotblast resists and of other engraving methods used to produce three dimensional images.

SUMMARY OF THE INVENTION

Accordingly, an object of the invention is a simplified method for producing a controlled and smoothly graduated three dimensional cut into a substrate.

In accordance with one embodiment of the invention, the method includes the steps of preparing a continuous tone transparency in which the areas required to be engraved to the deepest level are represented by a specific dark level of tone and the areas to be engraved to the shallowest level are represented by a specific and relatively much lighter level of tone, with the intermediate levels of engraving being represented by correspondingly intermediate levels of tone and areas not be engraved at all being left clear of tone. A resist film is then contact exposed through its film base and through the continuous tone transparency of the image to an actinic source of electromagnetic radiation for a specific quantity of exposure and the varying levels of radiation transmission through the various tones of the transparency result in a controlled differential exposure of the resist film. This correspondingly results in progressive hardening and toughening through the resist film from its film base accord- ing to the various levels of actinic radiation to which it is exposed. The unhardened areas are then washed out and a resist having a smoothly varying thickness is thus produced. The resist is then bonded to the substrate and shotblasted. As the shotblasting process proceeds, the thinner areas of the resist are progressively worn away, exposing more and more of the substrate to the action of the shot and thus automatically producing a controlled and smoothly graduated three dimensional cut into the substrate.

BRIEF DESCRIPTION OF THE DRAWINGS

The preferred embodiment of the invention will be described hereafter with reference to the following diagrams, all drawn in perspective except for FIG. 1, in which.

DETAILED DESCRIPTION OF THE PREFERRED EMBODIMENT

Figure 1:
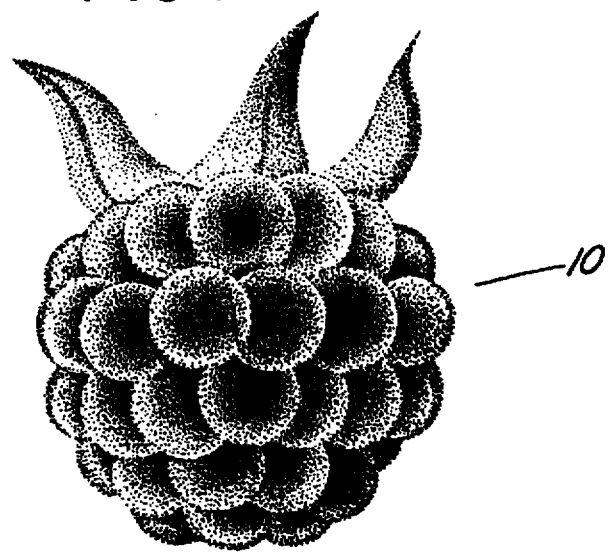
FIG. 1 shows a sample of original artwork.

FIG. 1 shows a sample of original artwork 10 representing the desired image to be engraved into a substrate. According to the invention, a continuous tone transparency of the artwork 10 is produced in which the areas required to be engraved to the deepest level are represented by a specific dark level of tone, the areas to be engraved to the shallowest level are represented by a specific and relatively much lighter level of tone, the areas to be engraved to intermediate levels are represented by correspondingly intermediate levels of tone, and areas not to be engraved at all are left completely clear of tone. The transparency is usually produced utilizing a computer to give the required precise levels of tonal control.

Figure 2:
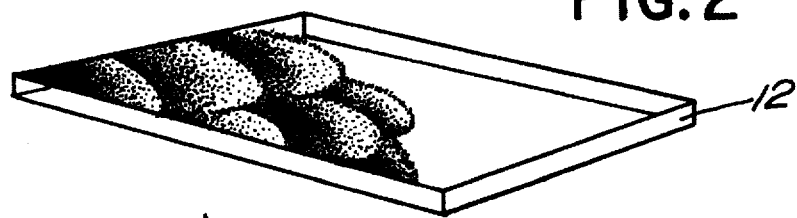
FIG. 2 represents a continuous tone transparency of part of the original artwork.

FIG. 2 represents a continuous tone transparency 12 of part of the original artwork. As illustrated, the transparency 12 has various levels of tone which correspond to the desired image to be engraved in the substrate.

Figure 3:
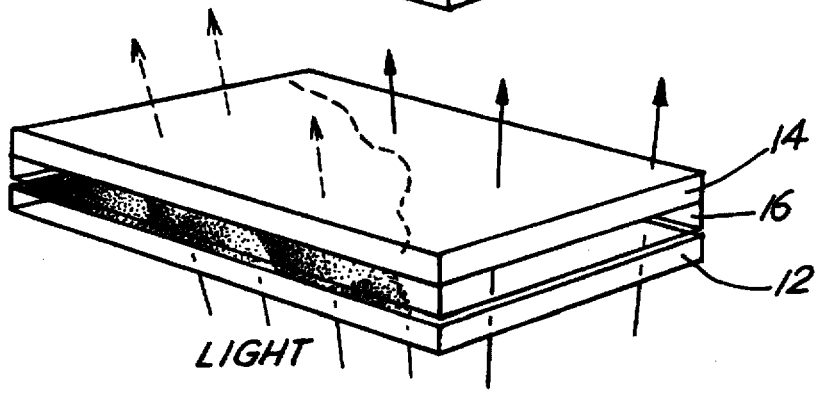
FIG. 3 shows a photopolymer film being contact exposed through the transparency.

FIG. 3 shows a photopolymer resist film 14 having a film base 16. The resist film 14 is shown being contact exposed to actinic light through the transparency 12 and through its film base 16. The darker the shade of tone on the transparency 12, the lesser the amount of light that will be allowed to pass through it during exposure. Correspondingly, the lighter the shade of tone, the more the amount of light that will be allowed to pass through it. In areas where there is no tone at all, virtually all of the light will be allowed to pass through. Thus, the varying levels of radiation transmission through the various tones of the transparency 12 result in a controlled differential exposure of the resist film 14. As explained below, this correspondingly results in progressive hardening and toughening through the resist film 14 from its film base 16 according to the various levels of actinic radiation to which it is exposed.

The resist film 14 is exposed to the actinic light for an amount of time that is sufficient to allow the film 14 to cure right through to its desired thickness in the fully exposed areas, but it is short enough so that the areas differentially shaded by the varying tones on the transparency will only receive the desired partial exposures and thus produce varying thicknesses of hardening and levels of resilience within the film 14.

Figure 4:
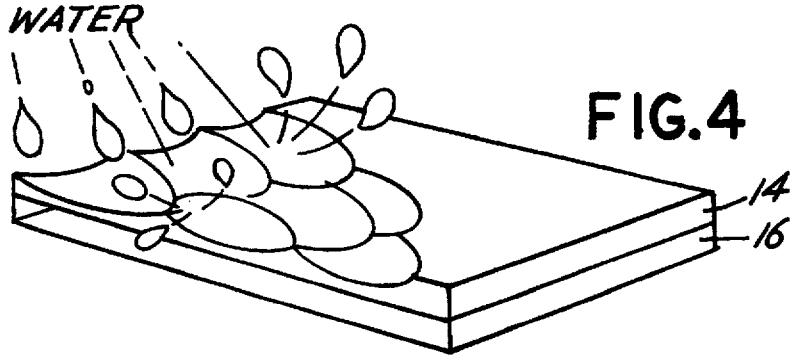
FIG. 4 shows the photopolymer film being washed out to produce the resist.

Referring to FIG. 4, after exposure, the areas of the film 14 that have received insufficient light to become insoluble are then washed away, leaving behind the insoluble areas of the film 14 (hereinafter referred to simply as the resist 14), still on the original film base 16. This resist 14 is then dried.

Figure 5:
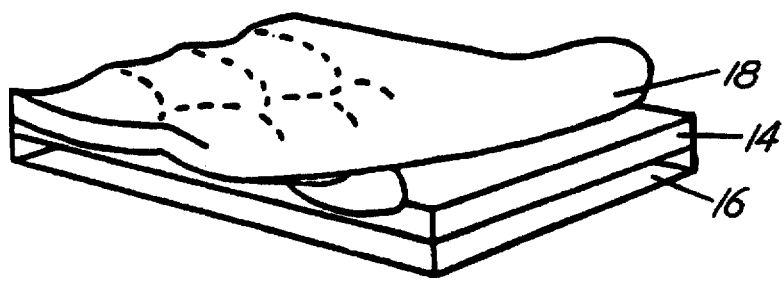
FIG. 5 shows a liquid carrier film being applied to the resist.
Figure 6:
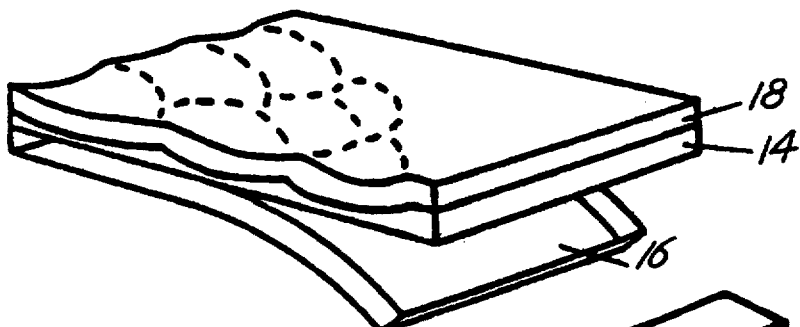
FIG. 6 shows the film base being removed from the combination of dried carrier film and resist.

Referring to FIG. 5, to assist in supporting the resist 14 while transferring it from its original base 16 onto the desired substrate, a liquid carrier film 18 is applied. This carrier film 18 is then dried. As depicted in FIG. 6, the film base 16 is then removed.

Figure 7:
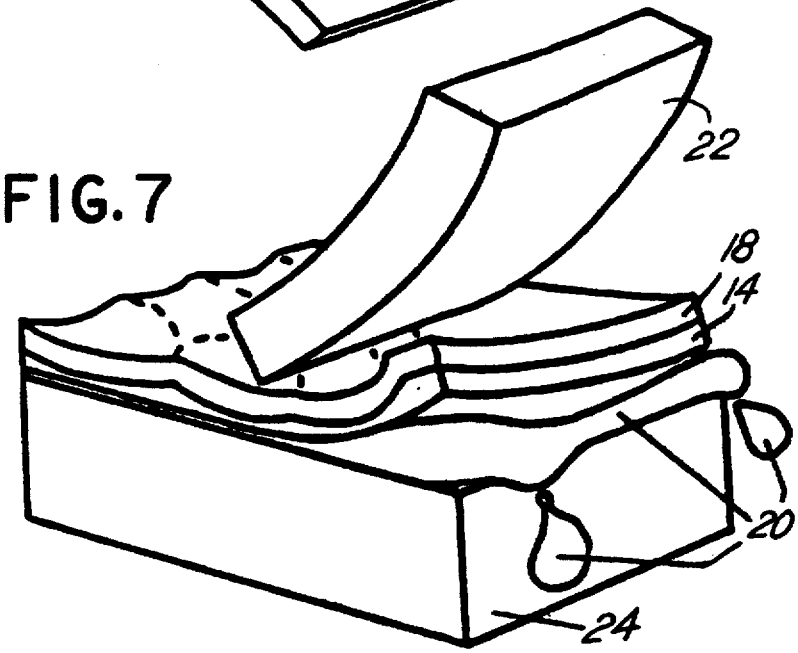
FIG. 7 shows the combination of carrier film and resist being squeegeed onto the substrate.

Referring to FIG. 7, the resultant laminate of carrier film 18 and resist 14 is located on a film of adhesive 20 onto the substrate 24. As much as possible of the adhesive 20 is then squeezed out from behind the resist 14 using a squeegee 22. The assembly is then allowed to dry.

Figure 8:
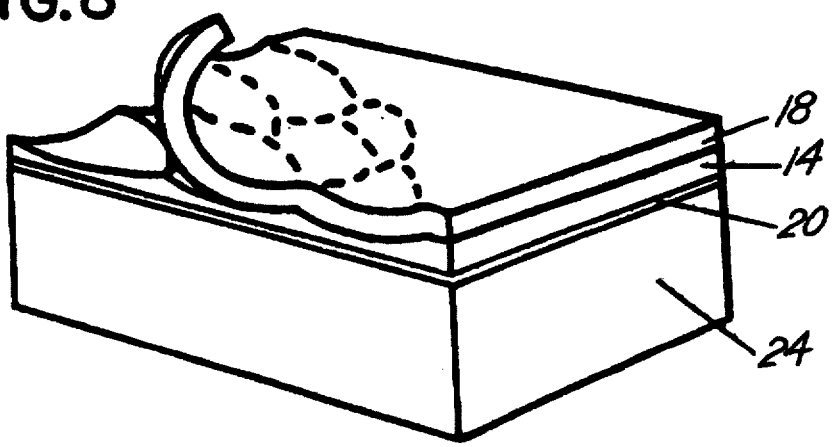
FIG. 8 shows the carrier film being removed from the resist.

Referring to FIG. 8, when the adhesive 20 has dried, bonding the resist 14 to the substrate 24, the carrier film 18 is peeled off.

Figure 9:
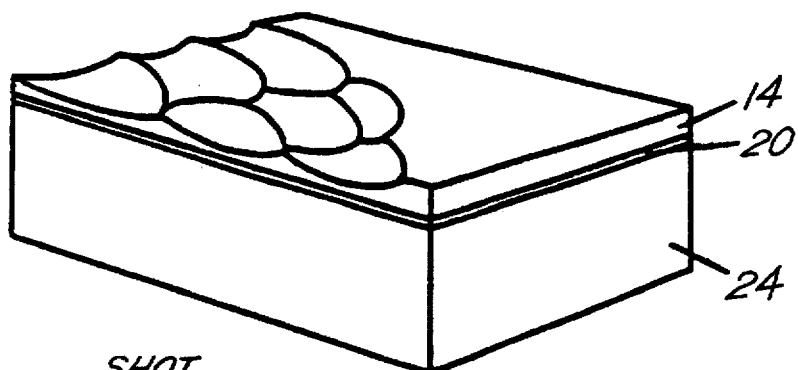
FIG. 9 shows the resist adhered to the substrate, prior to shotblasting.

As illustrated in FIG. 9, this leaves just the resist 14 and a thin layer of adhesive 20, closely bonded to the substrate 24.

Figure 10:
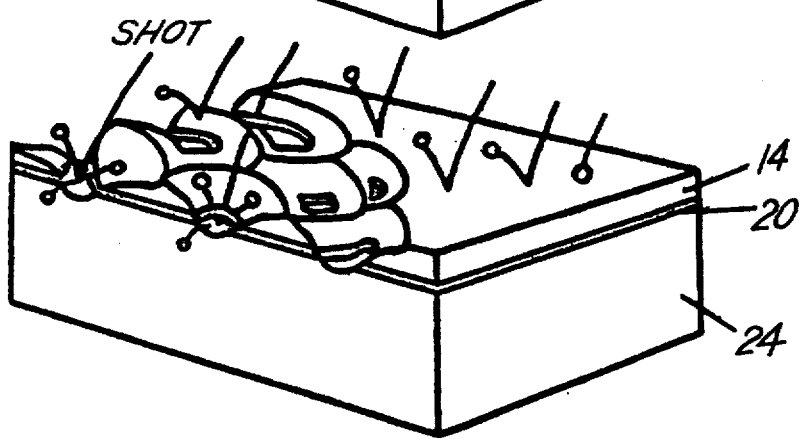
FIG. 10 shows an early part of the shotblasting process.

As depicted in FIG. 10, the resist 14 is then shotblasted. The thinnest areas of the resist 14 are worn away first, thus exposing the substrate 24 underneath to the action of the shot.

Figure 11:
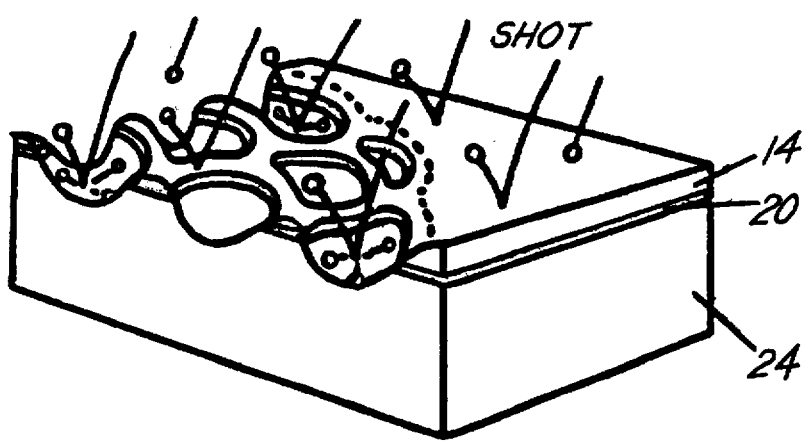
FIG. 11 shows a later part of the shotblasting process.

Referring to FIG. 11, as the shotblasting process proceeds, the thicker areas of the resist 14 are progressively worn away, exposing more and more of the substrate 24 to the action of the shot and thus automatically producing a controlled and smoothly graduated three dimensional cut into the substrate 24.

Figure 12:
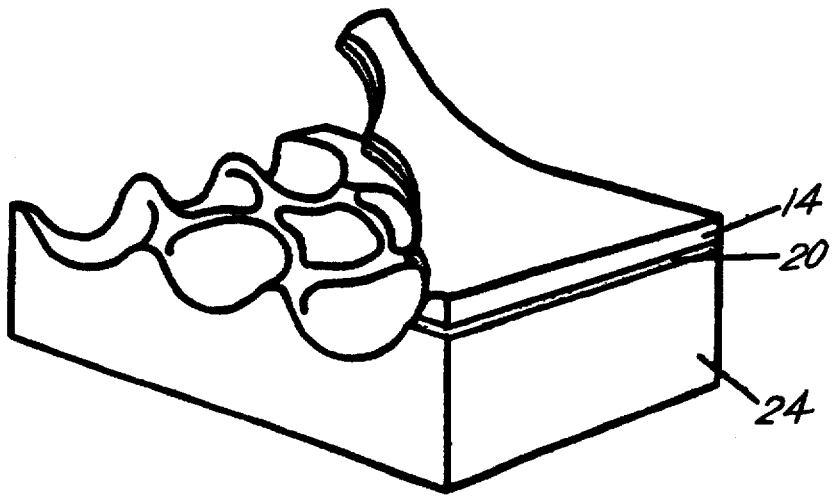
FIG. 12 shows the remains of the resist and adhesive being removed, leaving behind the engraved substrate.

Finally, referring to FIG. 12, when all of the desired image area of the resist 14 has been worn away and the substrate 24 underneath has been exposed to the required amount of shotblasting, the remains of the resist 14 and the bonding adhesive 20 are removed, leaving the desired three dimensional image engraved into the substrate 24.

As will be apparent to those skilled in the art, the method disclosed herein may find applications in a variety of techniques, including shotblast engraving into brittle substrates such as glass, stone, hard plastics or ceramics.

The transparency 12 of the invention may be a continuous tone photographic transparency. Such a transparency is preferably produced utilizing a computer to generate an image having the required precise levels of tonal control. This image is then output from the computer onto a transparent continuous tone photographic film using an imagesetter designed for producing such images, such as a "Solitaire" or a C.S.I. "Fire 800." The photographic transparency thus produced has precisely varying levels of tone. The areas required to be engraved to the deepest level are represented by a specific dark level of tone (e.g., 90% tone), the areas to be engraved to the shallowest level are represented by a specific and relatively much lighter level of tone (e.g., 60%), the areas to be engraved to intermediate levels are represented by correspondingly intermediate levels of tone (e.g., between 60% & 90%), and areas not to be engraved at all are left completely clear of tone (0% tone). As those skilled in the art will appreciate, the tone levels will vary depending upon the results desired.

The resist film 14 of the invention may be made by a number of methods using commercially available materials such as capillary photostencil films, or by preparing and coating a custom-made formulation comprising one or more ethylenically-unsaturated monomers and oligomers, one or more photo initiators and synergistic reagents, a water-soluble, aqueous-developable or solvent-soluble binder and, optionally, a dispersed or dissolved photopolymer. Other materials which may possibly be utilized include photosensitive direct stencil emulsions as used in the screen printing industry, filmic photoresist materials and liquid photoresists as used in the electronics industry.

When these types of resist films are exposed to a relatively small quantity of light through the film base, only a thin layer of the film, immediately adjacent to that base, will harden sufficiently to withstand the processing or washing out. The rest may then be washed away and thus only a relatively thin resist will be produced. If, however, the resist film is exposed to a relatively large quantity of light through its film base, the whole thickness of the film will harden sufficiently for none of it to be processed away, thus producing a correspondingly much thicker resist. This progressive relationship between exposure and thickness provides the mechanism for producing variable thickness resists.

Further, several of these types of resist films show a variation in toughness and resilience to shotblasting which is not dependent on the relative thickness of the exposed resist layer, but is dependent upon the method and rate of exposure, the type of actinic electromagnetic radiation source used, the temperature during exposure and the nature of the photohardening chemicals and system used in the resist film. Resist films incorporating hardening systems based on a photopolymerization process often suffer from oxygen inhibition of the photopolymerization as oxygen diffuses into the resist layer during exposure. This means that different rates and conditions of actinic exposure result in different polymerized and crosslinked molecular structures, which have different resistances to the shotblasting process. This difference in resilience of areas of resist film exposed to similar overall doses of actinic radiation, but under different exposure conditions, provides the mechanism for producing variable toughness resists that have differential resistances to the shotblasting process.

Suitable photopolymer films which may be used in the process of the invention include, but are not limited to, pre-coated capillary photostencil films as used for stencil production in the screen printing industry, such as Ulano CDF4 (Ulano Corporation, USA) and Capillex XR Films (Autotype International, UK); and specialist resist films for producing shotblast engraving masks, such as SuperMask Fine and SuperMask Heavy Duty (SuperMask Ltd, UK).

In the preferred embodiment of this invention, the photopolymer films are SuperMask Fine photoprocess shotblast resist film and SuperMask Heavy Duty photoprocess shotblast resist film, as sold in the UK by SuperMask Ltd, Argyll.

Suitable methods of transferring this film from its film base onto the substrate which may be used in the process of this invention include, but are not limited to, the following: signwriters transfer tape, such as Dorotape (Corotape Ltd, UK); a liquid applied material which dries to a flexible and conformable film which performs the function of an intermediate carrier film for the resist layer. Such liquid formulations include, but are not limited to, viscous solutions of natural or synthetic organic polymers or admixtures of these polymers with plasticizers and other additives. Examples are organic solutions of shellac, nitro-cellulose, polymethylmethacrylate, polybutylmethacrylate and copolymers of acrylic acid, methyl methacrylate and butyl methacrylate, dissolved in organic hydrocarbon solvents. An example of such a liquid applied material is SuperMask Carrier Film (SuperMask Ltd, UK).

In a preferred embodiment of this invention, the transfer method used is SuperMask Carrier Film, as sold in the UK by SuperMask Ltd, Argyll.

Suitable adhesives which may be used in the process of the invention include but are not limited to the following: water based dextrine adhesives such as Croda Gum (Croda Adhesives, U.K.) D1058 (Enterprise adhesives & Chemicals Ltd, UK) and SuperMask Water Based Adhesive (SuperMask Ltd, UK). In a preferred embodiment of this invention, the adhesive used is SuperMask Water Based Adhesive, sold in the UK by SuperMask Ltd, Argyll.

EXAMPLE

Prepare a continuous tone photographic transparency in which the deepest level to be engraved corresponds to 90% tone, the shallowest areas to be engraved correspond to 60% tone and the areas not to be engraved at all correspond as near as possible to 0% tone. Contact expose a sheet of SuperMask™ Fine Photoresist Film through the film base side and through this transparency, to a 1.6 kW metal halide bulb at a distance of 32 inches for a period of 105 seconds. Wash away all unhardened areas of the SuperMask™ Fine Photoresist Film with water and dry the remainder. Re-expose the whole of the SuperMask™ Fine Photoresist Film (that is a blanket exposure, not via the photographic transparency of the image this time). Brush coat a layer of (around 250 μmm wet thickness) SuperMask™ Carrier Film onto the resist film side of the SuperMask™ Fine Photoresist Film. Cure this coated sheet at a temperature of 55° C. in a well ventilated oven for a period of not less than one hour. When cured, peel the SuperMask™ Fine Photoresist Film/ SuperMask™ Carrier Film laminate off the original polyester film base of the SuperMask™ Fine Photoresist Film and discard the polyester. Trim the finished resist as appropriate and float onto the substrate (resist film side down) using SuperMask™ Water Based Adhesive diluted as per the instructions. Squeegee away any bubbles from behind the resist and as much of the excess glue as possible, thus achieving a very close bond. Allow the resist glue to dry thoroughly and then peel away the SuperMask™ Carrier Fill, leaving just the SuperMask™ Fine Photoresist Film bonded to the substrate. Shotblast the image using 320 (or finer) aluminum oxide grit directed at right angles to the substrate (the air pressure used will depend on the specific shotblasting equipment used—for example, a Guyson GGE siphon operated cabinet with a quarter inch nozzle and an 8 cfm jet would require a pressure of around 50 to 70 psi). Shotblasting a particular area of the image should proceed until all of the desired resist film (that is, those areas represented in the original photographic image by tones in the range 60% to 90%) has been blasted away and should stop immediately afterwards. Further blasting would only lead to erosion and blurring of the image. Wash the remains of the used resist away and lightly polish the image to emphasize the highlights.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the following claims will cover any such modifications or embodiments as fall within the true scope of the invention.

What is claimed is:

1. A method of making a shotblast resist capable of producing a smoothly graduated, three dimensional engraving in a substrate, comprising:

providing an image which is desired to be engraved in three dimensional fashion into a substrate;

preparing a transparency of said desired image, wherein said transparency has varying levels of tone that represent the varying levels of depth required in the desired image;

providing a resist film having a photosensitive resist layer and a base layer;

processing the resist film to impart a three dimensional version of the desired image onto the resist layer, said processing step including the steps of:

exposing the resist layer to a radiation source that is directed through both the transparency and the base layer into the resist layer for a specific quantity of exposure, whereby the varying levels of tone of the transparency result in controlled differential exposure of the resist layer to the radiation source, whereby said differential exposure to the radiation source results in variable thickness hardening of specific areas of the resist layer according to the various levels of light to which it is exposed;

processing the resist layer to remove unhardened areas of the top layer, thereby resulting in smoothly varying levels of thickness in the resist layer that correspond to a three dimensional version of the desired image.

2. A method according to claim 1 wherein said transparency is a continuous tone photographic transparency that is prepared by using a computer to generate an image having precise levels of varying tone, wherein said image is output from the computer onto a transparent continuous tone photographic film using an imagesetter designed for producing such images, thus producing a continuous tone transparency having precisely varying levels of tone.

3. A simplified method of producing a smoothly graduated, three dimensional engraving in a substrate, comprising:

providing an image which is desired to be engraved in three dimensional fashion into a substrate;

preparing a transparency of said desired image, wherein said transparency has varying levels of tone that represent the varying levels of depth required in the desired image;

providing a resist film having a photosensitive resist layer and a base layer;

processing the resist film to impart a three dimensional version of the desired image onto the resist layer, said processing step including the steps of:

exposing the resist layer to a radiation source that is directed through both the transparency and the base layer into the resist layer for a specific quantity of exposure, whereby the varying levels of tone of the transparency result in controlled differential exposure of the resist layer to the radiation source, whereby said differential exposure to the radiation source results in variable thickness hardening of specific areas of the resist layer according to the various levels of light to which it is exposed;

processing the resist layer to remove unhardened areas of the top layer, thereby resulting in smoothly varying levels of thickness in the resist layer that correspond to a three dimensional version of the desired image;

bonding the resist layer to the substrate; and shotblasting the resist layer, whereby the smoothly varying levels of thickness of the resist layer give the resist layer differential resistance to the shotblasting process, whereby as the shotblasting process proceeds, the thinner areas of the resist layer are progressively worn away, exposing more and more of the substrate to the action of the shot and thus producing a controlled and smoothly graduated three dimensional cut into the substrate, thereby producing a three dimensional version of the desired image in the substrate.

4. A method according to claim 3 wherein said transparency is a continuous tone photographic transparency that is prepared by using a computer to generate an image having precise levels of varying tone, wherein said image is output from the computer onto a transparent continuous tone photographic film using an imagesetter designed for producing such images, thus producing a continuous tone transparency having precisely varying levels of tone.

5. A method according to claim 3 wherein said resist film is a photopolymer film.

6. A simplified method of producing a smoothly graduated, three dimensional engraving in a substrate, comprising:

providing an image which is desired to be engraved in three dimensional fashion into a substrate;

preparing a transparency of said desired image, wherein said transparency has varying levels of tone that represent the varying levels of depth required in the desired image;

providing a resist film having a photosensitive resist layer and a base layer;

processing the resist film to impart a three dimensional version of the desired image onto the resist layer, said processing step including the steps of:

exposing the resist layer to a radiation source that is directed through both the transparency and the base layer into the resist layer for a specific quantity of exposure, whereby the varying levels of tone of the transparency result in controlled differential exposure of the resist layer to the radiation source, whereby said differential exposure to the radiation source results in variable thickness hardening of specific areas of the resist layer according to the various levels of light to which it is exposed;

processing the resist layer to remove unhardened areas of the top layer, thereby resulting in smoothly varying levels of thickness in the resist layer that correspond to a three dimensional version of the desired image;

applying a liquid carrier film to the resist layer;

removing the base layer from the resist layer;

bonding the resist layer to the substrate;

removing the carrier film from the resist layer; and shotblasting the resist layer, whereby the smoothly varying levels of thickness of the resist layer give the resist layer differential resistance to the shotblasting process, whereby as the shotblasting process proceeds, the thicker areas of the resist layer are progressively worn away, exposing more and more of the substrate to the action of the shot and thus producing a controlled and smoothly graduated three dimensional cut into the substrate, thereby producing a three dimensional version of the desired image in the substrate.

7. A method according to claim 6 wherein said transparency is a continuous tone photographic transparency that is prepared by using a computer to generate an image having precise levels of varying tone, wherein said image is output from the computer onto a transparent continuous tone photographic film using an imagesetter designed for producing such images, thus producing a continuous tone transparency having precisely varying levels of tone.

8. A shotblast resist made according to the process of claim 1.

9. An engraved substrate made according to the process of claim 3.

10. An engraved substrate made according to the process of claim 4.

11. An engraved substrate made according to the process of claim 6.

* * * * *